US 12,242,225 B2

(12) United States Patent
Yamashita

(10) Patent No.: US 12,242,225 B2
(45) Date of Patent: Mar. 4, 2025

(54) COOLING DEVICE AND IMAGE FORMING APPARATUS

(71) Applicant: KYOCERA Document Solutions Inc., Osaka (JP)

(72) Inventor: Kazuya Yamashita, Osaka (JP)

(73) Assignee: KYOCERA Document Solutions Inc., Osaka (JP)

( * ) Notice: Subject to any disclaimer, the term of this patent is extended or adjusted under 35 U.S.C. 154(b) by 0 days.

(21) Appl. No.: 18/361,527

(22) Filed: Jul. 28, 2023

(65) Prior Publication Data

US 2024/0036515 A1  Feb. 1, 2024

(30) Foreign Application Priority Data

Jul. 29, 2022  (JP) .................................. 2022-121318

(51) Int. Cl.
*G03G 21/20* (2006.01)
*G03G 15/01* (2006.01)
*H05K 7/20* (2006.01)

(52) U.S. Cl.
CPC ....... *G03G 21/206* (2013.01); *H05K 7/20263* (2013.01); *G03G 15/0121* (2013.01)

(58) Field of Classification Search
CPC .... G03G 21/20; G03G 21/203; G03G 21/206; H05K 7/20218–20281
See application file for complete search history.

(56) References Cited

U.S. PATENT DOCUMENTS

| 2010/0008695 | A1 | 1/2010 | Okano et al. |
| 2011/0170895 | A1* | 7/2011 | Fujiya ................... G03G 21/20 165/104.33 |
| 2012/0263491 | A1* | 10/2012 | Fujiya .................. G03G 21/206 165/104.33 |
| 2018/0356866 | A1* | 12/2018 | Saito ....................... H05K 7/20 |
| 2018/0363994 | A1* | 12/2018 | Saito .................. H05K 7/20272 |
| 2020/0209805 | A1* | 7/2020 | Yamashita ........... G03G 21/206 |

FOREIGN PATENT DOCUMENTS

| JP | 2010-020090 A | | 1/2010 |
| JP | 2020140107 A | * | 9/2020 |
| JP | 2023030898 A | * | 3/2023 |

OTHER PUBLICATIONS

Machine Translation of JP 2020-140107. Sep. 3, 2020. (Year: 2020).*

* cited by examiner

*Primary Examiner* — Carla J Therrien
(74) *Attorney, Agent, or Firm* — Studebaker & Brackett PC

(57) ABSTRACT

A cooling device includes a radiator, a tank, a circulation pipe, and a storage pool. The radiator dissipates heat of cooling medium. The tank stores the cooling medium. The circulation pipe allows the cooling medium to be conveyed from the radiator to the tank. The storage pool stores the cooling medium that has leaked from the tank. The tank includes a connector and a channel member. The connector connects the circulation pipe and the tank so that the circulation pipe communicates with an inside of the tank. The channel member guides the cooling medium leaking from the connector to the storage pool.

6 Claims, 5 Drawing Sheets

COOLING DEVICE AND IMAGE FORMING APPARATUS

INCORPORATION BY REFERENCE

The present application claims priority under 35 U.S.C. § 119 to Japanese Patent Application No. 2022-121318, filed on Jul. 29, 2022. The contents of this application are incorporated herein by reference in their entirety.

BACKGROUND

The present disclosure relates to a cooling device and an image forming apparatus.

In general, an image forming apparatus has been developed that includes joints through which pipes (inlet side pipes and outlet side pipes for coolant) provided for a heat-receiving member are connected to tubes for forming a circulation path.

SUMMARY

A cooling device according to an aspect of the present disclosure includes a radiator, a tank, a circulation pipe, and a storage pool. The radiator dissipates heat of cooling medium. The tank stores the cooling medium. The circulation pipe allows the cooling medium to be conveyed from the radiator to the tank. The storage pool stores the cooling medium that has leaked from the tank. The tank includes a connector and a channel member. The connector connects the circulation pipe and the tank so that the circulation pipe communicates with an inside of the tank. The channel member guides the cooling medium leaking from the connector to the storage pool.

DETAILED DESCRIPTION

Figure 1:
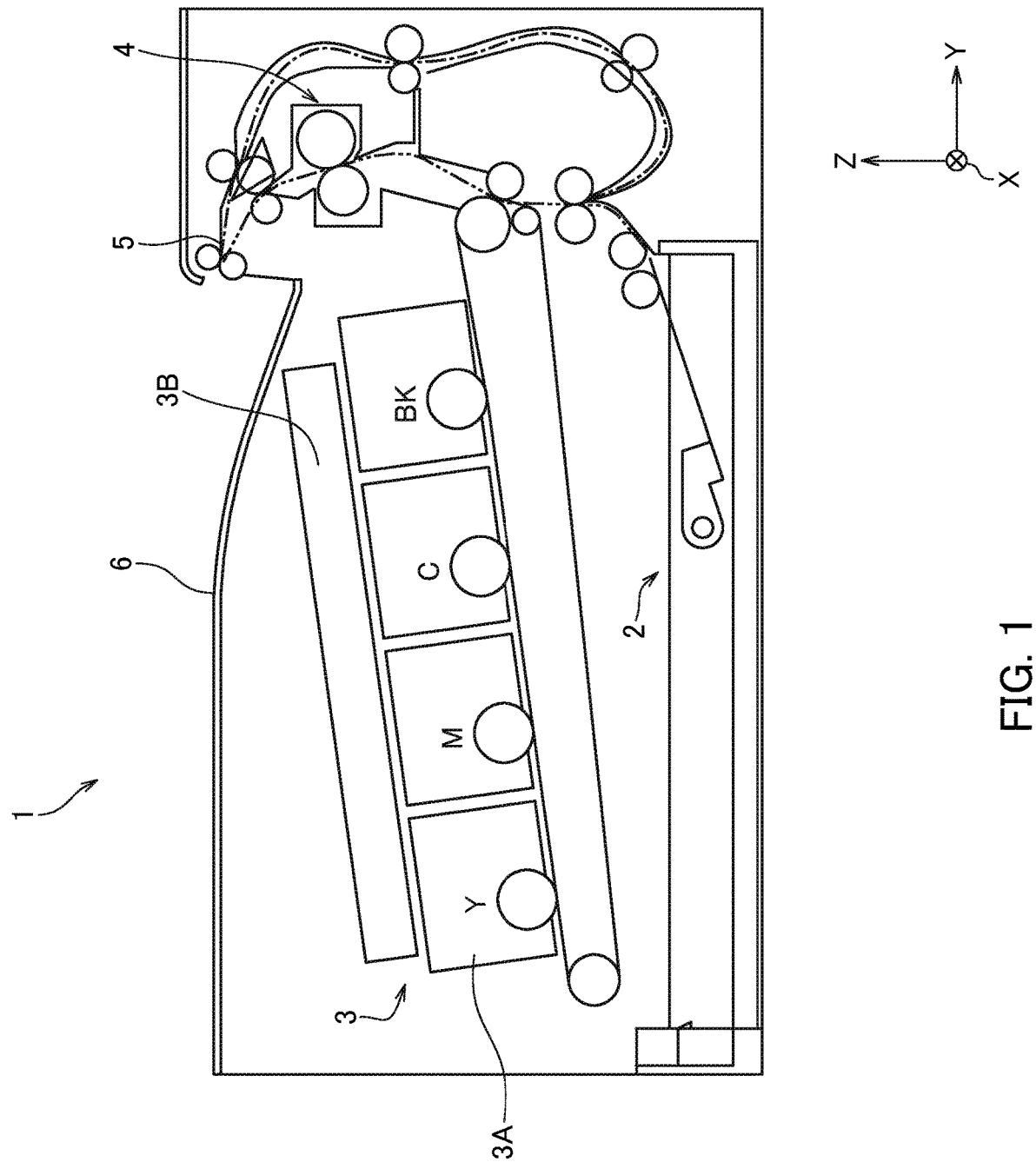
FIG. 1 is a diagram illustrating an image forming apparatus including a cooling device according to the present embodiment.

Hereinafter, an embodiment of the present disclosure will be described with reference to the drawings. Elements which are the same or equivalent are labeled the same reference signs in the drawings and description thereof is not repeated.

First, an image forming apparatus 1 will be described with reference to FIG. 1. FIG. 1 is a diagram illustrating the image forming apparatus 1 including a cooling device 3B according to the present embodiment.

The image forming apparatus 1 forms an image on a sheet.

The image forming apparatus 1 includes a sheet tray 2, an image forming section 3, a fixing device 4, a sheet ejecting section 5, and a sheet exit tray 6.

The sheet tray 2 stores sheets.

The image forming section 3 forms an image on a sheet using toner or ink. When the image forming apparatus is of an electrophotographic type, the image forming section includes a photosensitive member, a charger, a light exposure device, development devices 3A, the cooling device 3B, a transfer device, a cleaning device, and a static elimination device.

The photosensitive member is, for example a photosensitive drum. The photosensitive drum includes a cylindrical surface on which a photosensitive layer is provided. Examples of the photosensitive drum include a selenium drum and an organic photoconductor (OPC) drum.

The charger charges the photosensitive layer of the photosensitive member to a predetermined potential. The charger is, for example a corona discharger.

The light exposure device exposes the photosensitive layer of the photosensitive member by emitting a laser beam thereon. The light exposure device exposes the photosensitive layer of the photosensitive member according to image data. As a result, an electrostatic latent image is formed on the photosensitive member. The light exposure device includes, for example light emitting diodes (LEDs).

The development devices 3A store, for example two-component developer containing a magnetic carrier and toner. The development devices 3A develop the electrostatic latent image formed on the photosensitive member with toner to form a toner image on the photosensitive member. The transfer device transfers the toner image on the photosensitive member to a sheet. The cleaning device removes residual toner remaining on the photosensitive member after the transfer. The static elimination device removes any charges from the photosensitive member.

The development devices 3A generate heat due to frictional heat generated when the toner and carrier are agitated to apply chargeability to the toner.

The cooling device 3B cools the development devices 3A with cooling medium 32. The cooling device 3B will be described in further detail with reference to FIG. 2 and subsequent figures. Examples of the cooling medium 32 include water, and an antifreeze mixture such as ethylene glycol solution, propylene glycol solution.

When the image forming apparatus 1 is of an electrophotographic type, the fixing device 4 applies heat and pressure to the toner image developed on the sheet to fix the toner image on the sheet. The fixing device 4 includes, for example, a fixing roller, a heater, and a press roller.

The fixing roller is a hollow cylindrical roller. The fixing roller is pressed against the press roller. The press roller and the fixing roller form a nip part. The press roller is rotationally driven by a drive section (not illustrated), and forms the nip part along with the fixing roller, thereby rotating the fixing roller.

The heater is supplied with electric power from a power supply (not illustrated) to heat the fixing roller. The heater is arranged close to the inner peripheral surface of the fixing roller. The sheet conveyed to the fixing device 4 is heated by the heater while passing through the nip part, whereby the toner image is fixed.

The sheet ejecting section 5 ejects the sheet to the outside of a main body of the image forming apparatus 1. The sheet ejecting section 5 includes a sheet ejecting roller and the sheet exit tray 6. The sheet ejecting roller ejects, to the sheet exit tray 6, the sheet conveyed through a conveyor device from the fixing device 4. The sheet exit tray 6 stores the ejected sheet.

Figure 2:
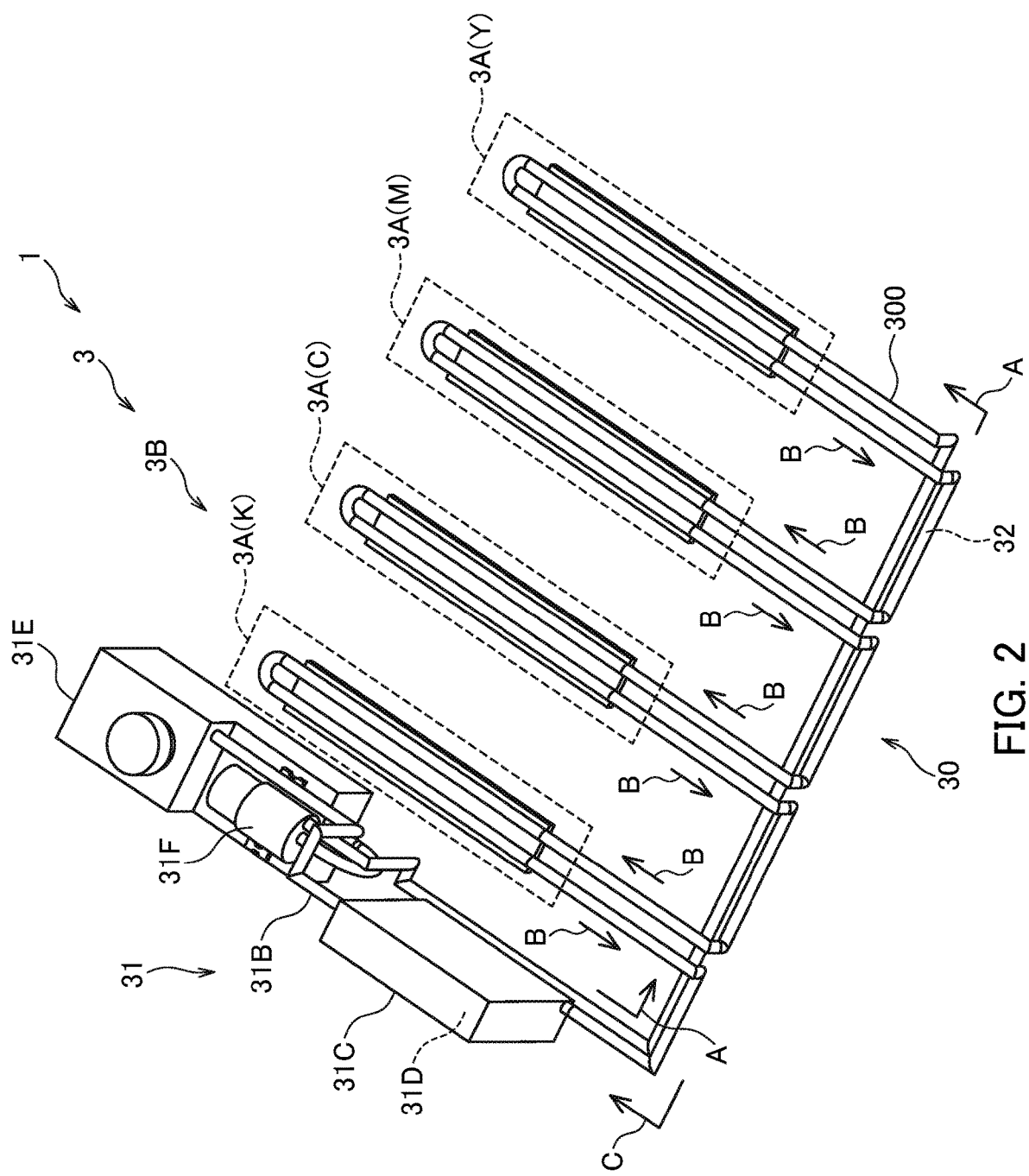
FIG. 2 is a diagram illustrating the relationship between a development device and the cooling device according to the present embodiment.
Figure 3:
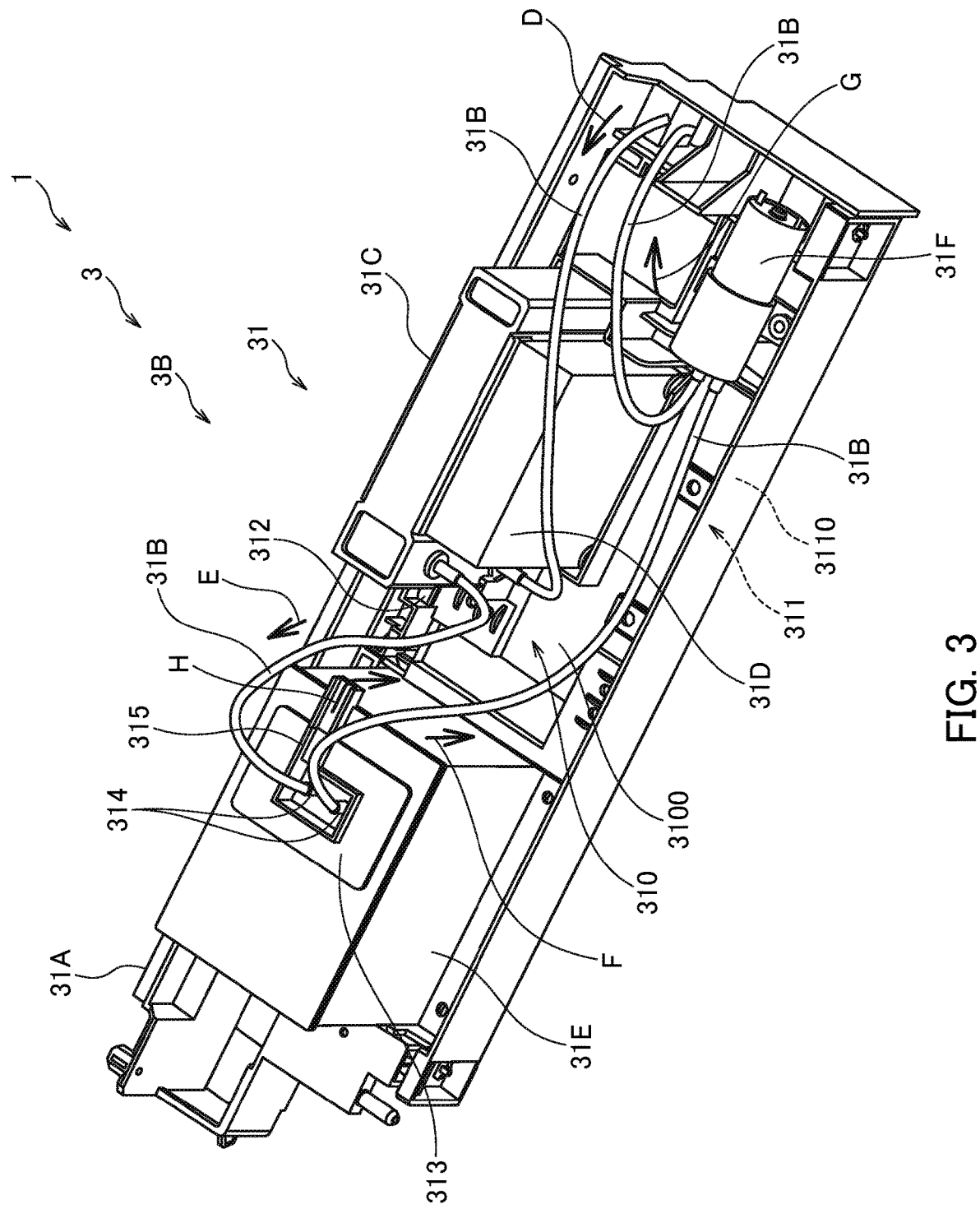
FIG. 3 is a diagram illustrating a heat-dissipating device of the cooling device according to the present embodiment.
Figure 4:
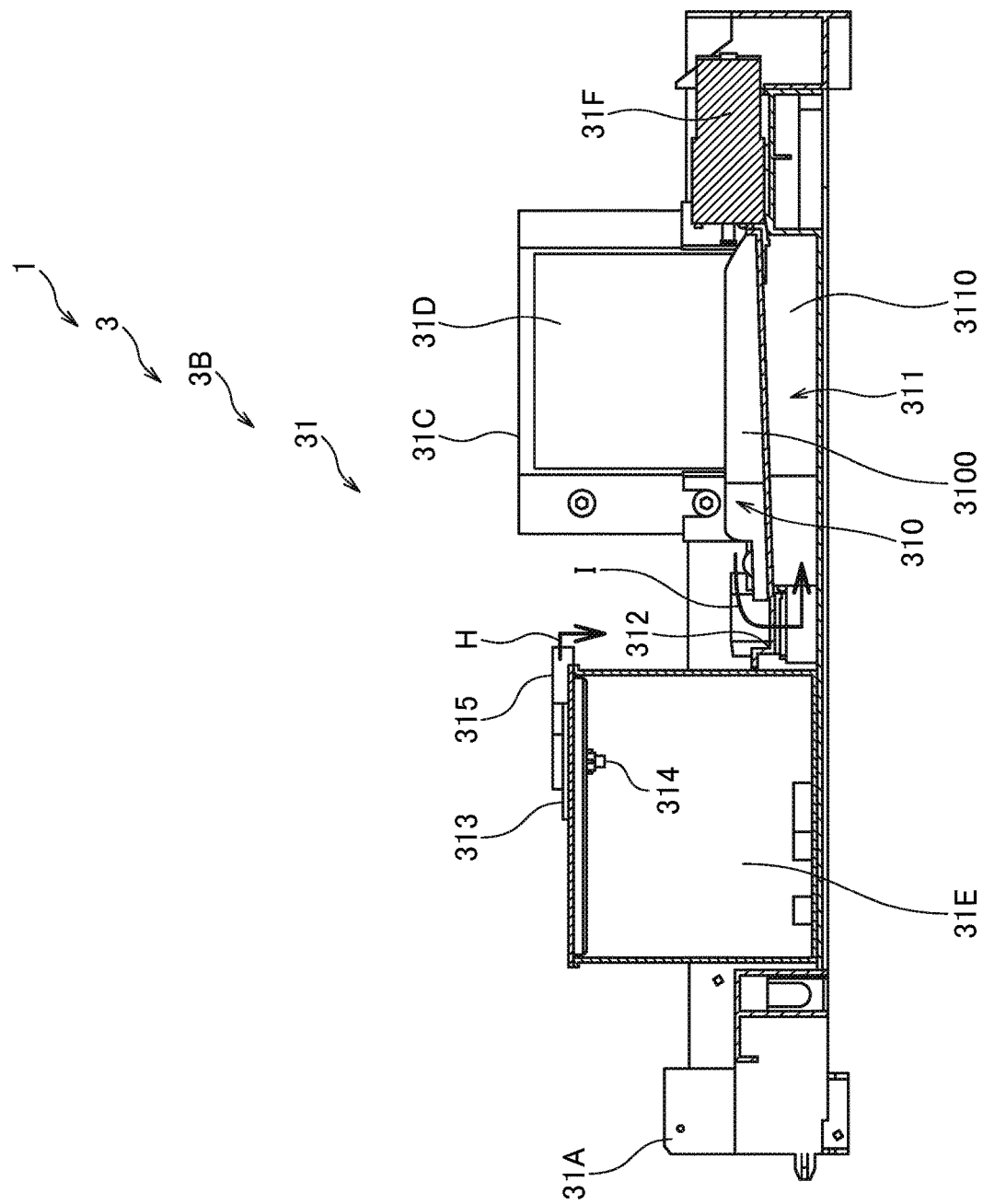
FIG. 4 is a longitudinal cross-sectional view of the heat-dissipating device of the cooling device illustrated in FIG. 3.
Figure 5:
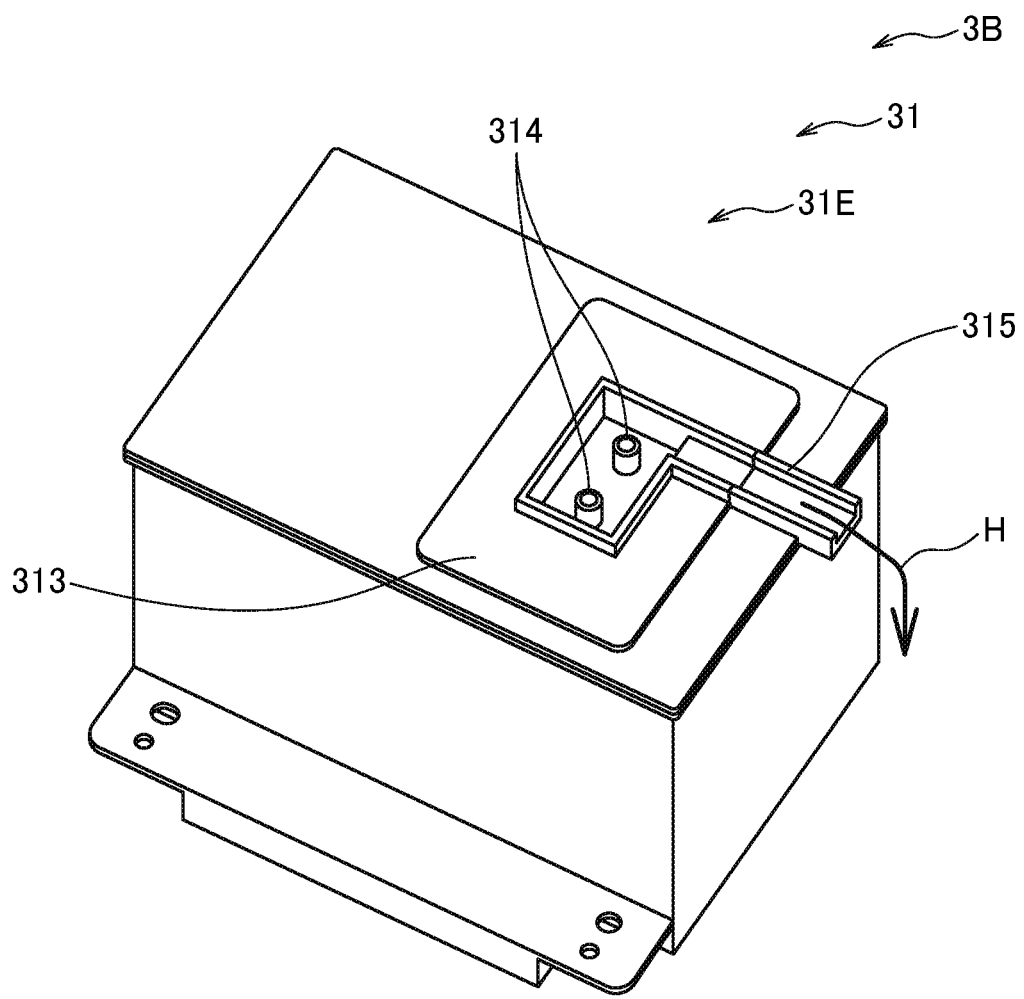
FIG. 5 is a diagram illustrating a tank in the heat-dissipating device of the cooling system illustrated in FIG. 3.

Next, the development devices 3A and the cooling device 3B according to the present embodiment will be described with reference to FIGS. 2 to 5 in addition to FIG. 1. FIG. 2 is a diagram illustrating the relationship between the development devices 3A and the cooling device 3B according to the present embodiment. FIG. 3 is a diagram illustrating a heat-dissipating device 31 of the cooling device 3B according to the present embodiment. FIG. 4 is a longitudinal sectional view of the heat-dissipating device 31 of the cooling device 3B illustrated in FIG. 3. FIG. 5 is a diagram illustrating a tank 31E of the heat-dissipating device 31 in the cooling device 3B illustrated in FIG. 3.

As illustrated in FIG. 2, each of the development devices 3A includes a development unit for each of a plurality of colors. In an example of the development devices 3A, a development device 3A (Y), a development device 3A (M), a development device 3A (C), and a development device 3A (K) are arranged as development units for each of yellow (Y), magenta (M), cyan (C), and black (K).

The cooling device 3B includes a heat-receiving device 30 and the heat-dissipating device 31.

The heat-receiving device 30 absorbs (receives) heat from the development devices 3A.

The heat-receiving device 30 includes a heat-receiving pipe 300. The heat-receiving pipe 300 allows the cooling medium 32 to be conveyed through. The cooling medium 32 circulates through the heat-receiving pipe 300, thereby cooling the development devices 3A. In an example, the heat-receiving pipe 300 is installed through the development device 3A (Y), the development device 3A (M), the development device 3A (C), and the development device 3A (K) in this order, and absorbs (receives) heat through the cooling medium 32.

In the present embodiment, the cooling medium 32 suitably circulating through the heat-receiving pipe 300 receives heat from (cools) the development devices 3A.

The development units 3A (the development device 3A (Y), the development device 3A (M), the development device 3A (C), and the development device 3A (K)) may be cooled through one heat-receiving pipe 300 passing through all the development units 3A.

The development devices 3A are suitably cooled by a simple configuration in the present embodiment.

The heat-dissipating device 31 cools the cooling medium 32 that have absorbed (received) heat from the development devices 3A. The heat-dissipating device 31 will be described in detail with reference to FIG. 3 and subsequent figures.

FIG. 3 is a diagram illustrating the heat-dissipating device 31 of the cooling device 3B according to the present embodiment. FIG. 4 is a longitudinal sectional view of the heat-dissipating device 31 of the cooling device 3B illustrated in FIG. 3.

The heat-dissipating device 31 includes a case 31A (FIG. 3), circulation pipes 31B, a radiator 31C, a cooling fan 31D, the tank 31E, and a pump 31F.

As illustrated in FIGS. 3 and 4, the case 31A is a box member that houses the radiator 31C, the cooling fan 31D, the tank 31E, and the pump 31F.

Circulation pipes 31B are connected with the heat-receiving pipe 300, described with reference to FIG. 2, which receives heat from the development devices 3A. Each circulation pipe 31B is, for example, a hollow pipe member made of resin or the like. The circulation pipes 31B allow cooling medium 32 to circulate through.

In FIGS. 3 and 4, the heat from the cooling medium 32 is to radiate through the radiator 31C.

The cooling fan 31D blows air to the radiator 31C to dissipate heat from the cooling medium 32 passing through the radiator 31C.

That is, the heat-receiving pipe 300 of the heat-receiving device 30 illustrated in FIG. 2 is connected to the circulation pipes 31B illustrated in FIG. 3. The radiator 31C illustrated in FIG. 3 is connected to circulation pipes 31B.

The cooling medium 32 that has absorbed the heat of the development devices 3A flow in Direction C when flowing in Direction B through the heat-receiving pipe 300 from the heat-receiving device 30 illustrated in FIG. 2, and then passes through the circulation pipe 31B in Direction D and enters the radiator 31C as illustrated in FIG. 3. The radiator 31C allows the cooling medium 32 to flow inside, and radiates the heat using heat conduction by the air supplied from the cooling fan 31D.

The tank 31E illustrated in FIGS. 3 to 5 stores the cooling medium 32. That is, the circulation pipe 31B connects the radiator 31C and the tank 31E as illustrated in FIG. 3.

The circulation pipe 31B allows the cooling medium 32 to be conveyed from the radiator 31C to the tank 31E.

Tank 31E includes connectors 314. The connectors 314 connect the circulation pipes 31B and the tank 31E, whereby the circulation pipes 31B communicate with the inside of the tank 31E. The cooling medium 32 whose heat has radiated through the radiator 31C passes through the circulation pipe 31B in Direction E and enters the tank 31E. The tank 31E is a hollow box member and stores therein the cooling medium 32.

The pump 31F illustrated in FIGS. 3 and 4 circulates the cooling medium 32. The circulation pipes 31B connected to the tank 31E using the connectors 314 extends to the pump 31F and is connected with the pump 31F.

The pump 31F sucks, in Direction F, the cooling medium 32 flowing inside the circulation pipes 31B.

The pump 31F is further connected to the circulation pipe 31B. The circulation pipe 31B is connected to the heat-receiving pipe 300 of the heat-receiving device 30 illustrated in FIG. 2. Therefore, the cooling medium 32 sucked by the pump 31F is sent through the circulation pipe 31B in Direction G, and passes through the heat-receiving pipe 300 in Direction A of the heat-receiving device 30 illustrated in FIG. 2, whereby the cooling medium 32 is directed to the development devices 3A to cool the development devices 3A.

In FIGS. 3 and 4, the case 31A includes a first layer 310, a second layer 311, and a communication hole 312.

The first layer 310 includes a storage pool 3100.

The storage pool 3100 stores cooling medium 32 that has leaked from the tank 31E.

The second layer 311 includes a storage tank 3110. The storage tank 3110 is formed below the storage pool.

The communication hole 312 allows the storage pool 3100 and the storage tank 3110 to communicate.

The cooling medium 32 stored in the storage pool 3100 flows in Direction I through the communication hole 312, while the storage tank 3110 collects the cooling medium 32. This makes it possible to prevent other devices from being contaminated.

In the present embodiment, the storage tank 3110 can collect, therein through the communication hole 312, the cooling medium 32 that has leaked into the storage pool 3100.

The tank 31E includes an upper lid 313, the connectors 314, and a channel member 315 as illustrated in FIGS. 3 to 5.

In FIG. 5, the upper lid 313 is a member that opens and closes an opening formed in the upper surface of the tank 31E.

The connectors 314 are placed on the upper surface of the tank 31E.

In the present embodiment, since the connectors 314 are placed on the upper surface of the tank 31E, the cooling medium 32 inside the tank 31E is less likely to leak from the side of the connectors 314.

The channel member 315 guides the cooling medium 32 leaking from the connectors 314 to the storage pool 3100 in Direction H.

In the present embodiment, it is possible to suitably store the cooling medium 32 leaking from the tank 31E.

As illustrated in FIGS. 3 and 4, the channel member 315 includes a discharge end for the cooling medium 32, which is formed to extend above the storage pool 3100.

The cooling medium 32 flows through the channel member 315 in Direction H and drops in Direction H from the discharge end of the channel member 315 into the storage pool 3100.

In the present embodiment, the cooling medium 32 leaking from the tank 31E is prevented from staining the tank 31E and is suitably stored in the storage pool 3100.

As illustrated in FIG. 4, the storage pool 3100 is inclined so that the cooling medium 32 stored in the storage pool 3100 flows through the communication hole 312.

That is, the cooling medium 32 dropped and stored in the storage pool 3100 flows in the inclined direction of the storage pool 3100, drops in Direction I from the communication hole 312, and is stored in the storage tank 3110.

In the present embodiment, the cooling medium 32 in the storage pool 3100 can be stored in the storage tank 3110 and reused.

The embodiment of the present disclosure is described above with reference to the accompanying drawings. However, the present disclosure is not limited to the above embodiment and may be implemented in various manners within a scope not departing from the gist thereof. The drawings mainly illustrate the constituent elements schematically to facilitate understanding thereof. Aspects such as number of the constituent elements illustrated in the drawings may differ in practice for convenience of drawing preparation. Furthermore, the constituent elements illustrated in the above embodiment are examples and not particular limitations. The constituent elements may be variously altered within a scope not substantively departing from the effects of the present disclosure.

What is claimed is:

1. An image forming apparatus comprising a cooling device, wherein
the cooling device includes:
a radiator that dissipates heat of cooling medium;
a tank that stores the cooling medium;
a circulation pipe that allows the cooling medium to be conveyed from the radiator to the tank; and
a storage pool that stores the cooling medium that has leaked from the tank, and
the tank includes:
an opening formed in an upper surface;
an upper lid that opens and closes the opening;
a connector that is placed on the upper lid and connects the circulation pipe and the tank so that the circulation pipe communicates with an inside of the tank; and
a channel member that is placed on the upper lid and guides the cooling medium leaking from the connector to the storage pool.

2. The image forming apparatus according to claim 1, wherein the channel member includes a discharge end for the cooling medium, the discharge end being formed to extend above the storage pool.

3. The image forming apparatus according to claim 1, further comprising a case provided with the radiator, the tank, and the storage pool, wherein
the case is further provided with:
a storage tank formed below the storage pool; and
a communication hole that allows the storage pool and the storage tank to communicate.

4. The image forming apparatus according to claim 3, wherein the storage pool is inclined so that the cooling medium stored in the storage pool flows through the communication hole.

5. The image forming apparatus according to claim 1, comprising a development device that develops, with toner, an electrostatic latent image formed on a photosensitive member, wherein
the circulation pipe is connected to a heat-receiving pipe that receives heat from the development device, and
the cooling medium cools the development device with the cooling medium circulated through the heat-receiving pipe.

6. The image forming apparatus according to claim 5, wherein
the development device includes a development unit for each of a plurality of colors, and
the development units are cooled with one heat-receiving pipe passing through all the development units.

* * * * *